(12) United States Patent
Ferizovic et al.

(10) Patent No.: US 10,340,570 B2
(45) Date of Patent: Jul. 2, 2019

(54) MICROELECTRONIC RF SUBSTRATE WITH AN INTEGRAL ISOLATOR/CIRCULATOR

(71) Applicant: Northrop Grumman Systems Corporation, Falls Church, VA (US)

(72) Inventors: Dino Ferizovic, Torrance, CA (US); Alexis Zamora, Torrance, CA (US); Benjamin Poust, Hawthorne, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 142 days.

(21) Appl. No.: 15/794,078

(22) Filed: Oct. 26, 2017

(65) Prior Publication Data
US 2019/0131681 A1 May 2, 2019

(51) Int. Cl.
| | |
|---|---|
| *H01P 1/387* | (2006.01) |
| *H01P 1/36* | (2006.01) |
| *H01L 27/04* | (2006.01) |
| *H01P 1/12* | (2006.01) |
| *H01P 1/38* | (2006.01) |

(52) U.S. Cl.
CPC ............... *H01P 1/36* (2013.01); *H01L 27/04* (2013.01); *H01P 1/127* (2013.01); *H01P 1/38* (2013.01); *H01P 1/387* (2013.01)

(58) Field of Classification Search
CPC .... H01P 1/36; H01P 1/38; H01P 1/383; H01P 1/387; H01P 1/215; H01P 1/217; H01P 1/218
USPC .................................................. 333/1.1, 24.2
See application file for complete search history.

(56) References Cited

U.S. PATENT DOCUMENTS

| | | | | |
|---|---|---|---|---|
| 2001/0017576 | A1* | 8/2001 | Kondo | H03F 1/56 333/24.2 |
| 2001/0028280 | A1* | 10/2001 | Maruhashi | H01P 1/387 333/1.1 |
| 2014/0323064 | A1* | 10/2014 | McCarthy | H04B 1/40 455/77 |

OTHER PUBLICATIONS

Oliver, S.A., et al; Integrated Self-Biased Hexaferrite Microstrip Circulators for Millimeter-Wavelength Applications; IEEE Transactions on Microwave Theory and Techniques, vol. 49, No. 2; Feb. 2001; pp. 385-387; 2001 IEEE.
Chang, K. et al; W-Band (75-110 CHz) Microstrip Components; IEEE Transactions on Microwave Theory and Techniques, vol. MTT-33, No. 12; Dec. 1985; pp. 1375-1382; 1985 IEEE.

* cited by examiner

*Primary Examiner* — Stephen E. Jones
(74) *Attorney, Agent, or Firm* — McCracken & Gillen LLC

(57) ABSTRACT

An exemplary electronic assembly includes a planar semiconductor substrate having a front side with semiconductor components and a back side that includes one recess extending inwardly. One of an isolator and circulator is formed as part of the planar semiconductor substrate and includes one magnetic ferrite disk mounted within the one recess within the thickness of the planar semiconductor substrate. The one of an isolator and circulator has at least input and output ports. The input port is disposed to receive a radio frequency signal to be coupled with low insertion loss to the output port while providing high insertion loss to other radio frequency signals attempting to propagate from the output port to the input port.

15 Claims, 3 Drawing Sheets

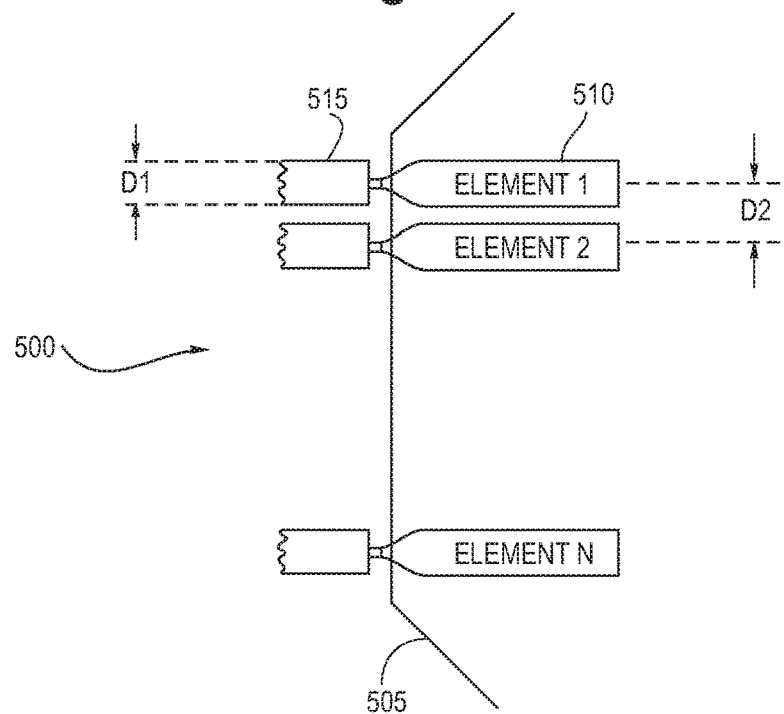
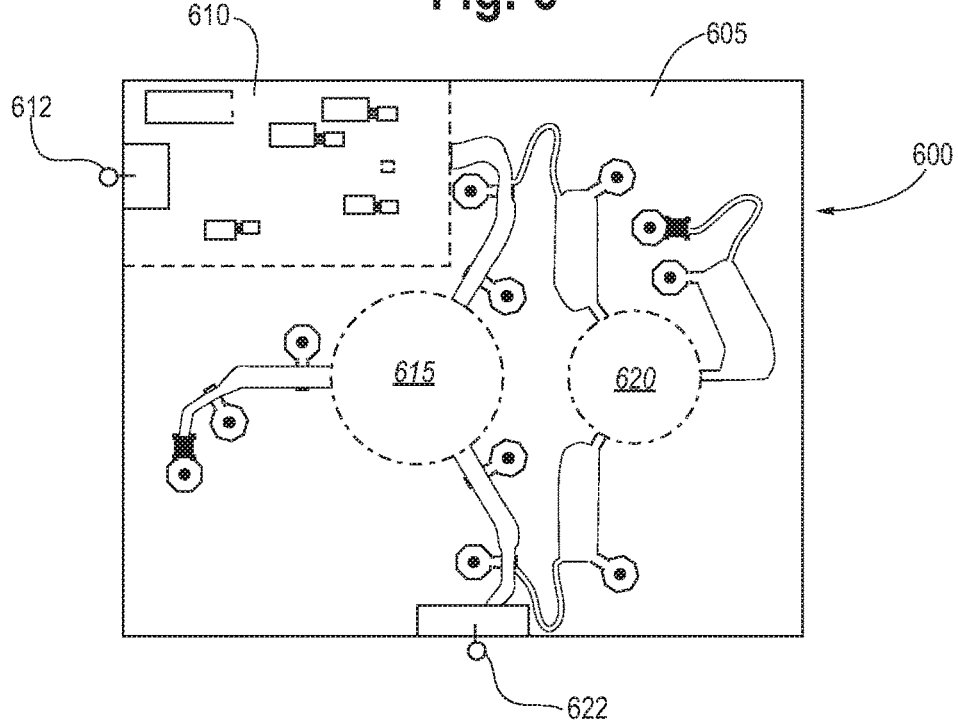

MICROELECTRONIC RF SUBSTRATE WITH AN INTEGRAL ISOLATOR/CIRCULATOR

BACKGROUND

This invention relates to planar electronic substrates with radio frequency (RF) circuitry that are used to transmit and/or receive very high frequency RF signals in which signal isolation/separation is achieved using a magnetically based isolator or circulator.

Non-reciprocal devices such as circulators and isolators provide an important role in RF systems by providing high transfer efficiency for RF signals in one path while minimizing the transfer of RF signals in another path. For example, a 3-port circulator with the ports connected to the output of the transmitter, input of a receiver and an antenna permits the transmission from the transmitter of an RF signal to the antenna while simultaneously allowing a different frequency to be coupled from same antenna to the receiver to enable duplex operation. The simultaneous transmission and reception of different frequency RF signals is facilitated by the circulator which minimizes the coupling of the transmission RF signal to the receiver port while providing only a minimal loss between the transmitter and the antenna. Also, the received RF signal, which has a different frequency from the transmitted RF signal, is coupled from the antenna to the receiver with only a minimal loss.

Although circulators are used in duplex RF transmission systems, typical circulators have a large footprint relative to the wavelength of the subject high frequency RF signal. This limits the applicability of such circulators especially where physical space requirements and/or weight requirements are important. It will be appreciated that wavelength is inversely proportional to frequency so that for very high frequency RF signals the corresponding wavelength can be very small. There exists a need to minimize the size of a circulator/isolator to accommodate a minimum footprint on an RF substrate, especially at very high frequencies, so that the size of the substrate which includes a circulator/isolator is small relative to a wavelength.

SUMMARY

It is an object of the present invention to satisfy this need.

An exemplary electronic assembly includes a planar semiconductor substrate having a front side with semiconductor components and a back side that includes one recess extending inwardly. One of an isolator and circulator is formed as part of the planar semiconductor substrate and includes one magnetic ferrite disk mounted within the one recess within the thickness of the planar semiconductor substrate. The one of an isolator and circulator has at least input and output ports. The input port is disposed to receive a radio frequency signal to be coupled with low insertion loss to the output port while providing high insertion loss to other radio frequency signals attempting to propagate from the output port to the input port.

DESCRIPTION OF THE DRAWINGS

Features of exemplary implementations of the invention will become apparent from the description, the claims, and the accompanying drawings in which:

FIG. 5 shows an exemplary high density utilization of substrates in accordance with FIG. 1.

FIG. 6 is a top view of an exemplary planar electronic substrate that includes an isolator in accordance with an embodiment of the present invention.

DETAILED DESCRIPTION

An aspect of the present invention resides in the recognition that reducing the size of a magnetic based circulator/isolator so it can be integrated as part of an electronic substrate would provide a reduction in the minimum achievable spacing among adjacently mounted substrates. This was recognized to be especially important for high-frequency applications, e.g. W-band (75-100 GHz), where 1.6 mm is approximately one half wavelength. For applications in which it is important to maintain phase relationships, e.g. a phased array antenna with a plurality of separately driven elements where each element is directly driven by a corresponding electronic substrate, it is important to keep the spacing between adjacent electronic substrates to less than one half wavelength in order to minimize undesired antenna patterns, e.g. unwanted lobes.

Figure 1:
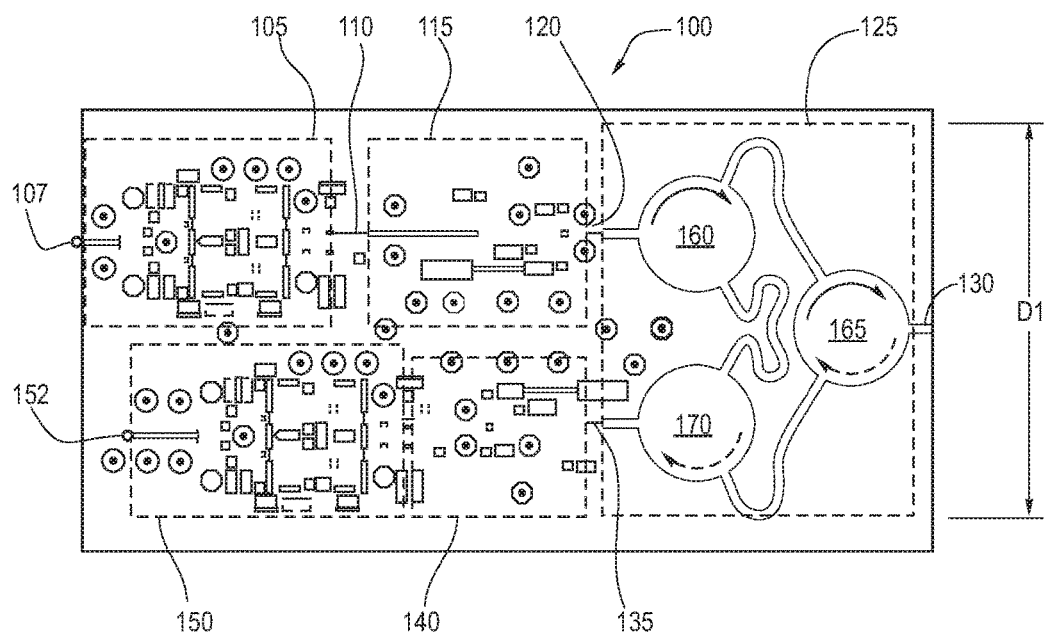
FIG. 1 is a top view of an exemplary planar electronic substrate that includes a circulator in accordance with an embodiment of the present invention.

FIG. 1 shows a top view of an exemplary planar electronic substrate 100 that includes a phase shifter 105 with an input 107 that receives a RF signal to be transmitted from other transmitter circuitry not located on substrate 100. The output 110 of the phase shifter 105 is coupled to a power amplifier 115. The output of the power amplifier is coupled to an input port 120 of circulator 125 which has a port 130 to be coupled to an antenna and a port 135 coupled to the input of a low noise amplifier 140. The output of the low noise amplifier 140 is coupled to the input of a phase shifter 150 having an output 152 coupled to other receiver circuitry not located on the substrate 100. The substrate 100 is a semiconductor substrate that may be manufactured from a single semiconductor wafer on which is manufactured a plurality of identical semiconductor substrates.

In the exemplary circulator 125, three separate magnetic-type circulator elements 160, 165 and 170 are interconnected to provide high isolation, i.e. the antenna RF signal on port 120 is coupled to the antenna port 130 with little attenuation while the same RF signal appears at the receiver port 135 with a high level of attenuation, and a receive RF signal from an antenna coupled to port 130 is transferred to the receiver port 135 with little attenuation while the same RF signal appears at the transmitter port 120 with a high level of attenuation. The solid line arrows associated with circulator elements 160 and 165 and the dashed line arrows associated with circulator elements 165 and 170 indicate the pair of ports where RF signals pass with little attenuation. In the illustrative configuration circulator element 165 functions as a circulator and the circulator elements 160 and 170 effectively function as isolators. The strength of the internal field of each isolator/circulator element should be high for self-biased ferrites. This can be accomplished by high saturation magnetization and high anisotropy field which is a property of self-biased ferrites and is the main property determining the strength of the internal field. For traditional ferrites, high saturation magnetization and high external bias can be provided by a strong magnet.

The width D1 of the exemplary semiconductor substrate 100 is 1.6 mm. The dimension D1 is important for high-frequency applications where this dimension is compared to one wavelength of the frequency of the RF signals being processed. For example, at W-band (75-100 GHz), 1.6 mm is approximately one half wavelength of the highest frequency in the range. For applications where a plurality of such substrates are directly coupled to corresponding antenna elements in a phased array antenna, the spacing between the respective antenna elements may be required to be no greater than a certain maximum distance, e.g. one half wavelength, in order to provide a desired antenna pattern. Where each substrate is directly coupled to a corresponding antenna element, this provides a corresponding requirement that the width of the substrate also be no greater than the certain maximum distance in order for the substrates to physically fit within the spacing between adjacent antenna elements. The thickness of the substrate 100, which includes the circulator elements, can be as thin as 0.2 mm and preferably 0.1 mm. The circulator provides isolation (of transmission RF signal at the antenna port relative to the receiver port) of about 40 dB across the W band with low insertion loss, e.g. about 0.6 dB. Thin film resistors and capacitors in addition to integrated and/or surface mounted semiconductors as well as through-hole interconnections are utilized.

Figure 2:
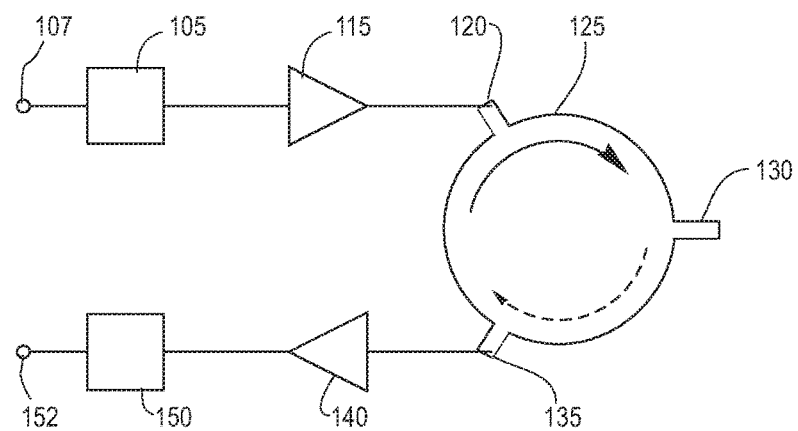
FIG. 2 is a block diagram of representative circuitry contained in FIG. 1.

FIG. 2 shows a block diagram of circuitry contained in substrate 100. At input 107 the transmit radio frequency signal is received and processed by the phase shifter 105 before being coupled to the power amplifier 115 that has its output connected to the input port 120 of circulator 125. The antenna port 130 of circulator 125 couples the transmit RF signal from port 120 to the antenna and couples a received RF signal from the antenna to receiver port 135 of circulator 125. A low noise amplifier 140 amplifies the receive RF signal from port 135 and couples its output to a phase shifter 150 which provides an output 152 to further receiver circuitry.

It will be understood that the circuitry functions provided on substrate 100 may vary. For example, a substrate in accordance with the present invention could only contain a power amplifier, circulator, and receive RF signal amplifier. Alternatively, such a substrate could contain a transmit RF signal component, circulator and receive RF signal component where the transmit RF signal component and receive RF signal component merely serve to link the respective RF signals to/from the respective ports of the circulator. Additionally, a substrate in accordance with the objectives of the present invention could only contain a transmit power amplifier and an isolator where a receive RF signal requirement is not present.

Figure 3:
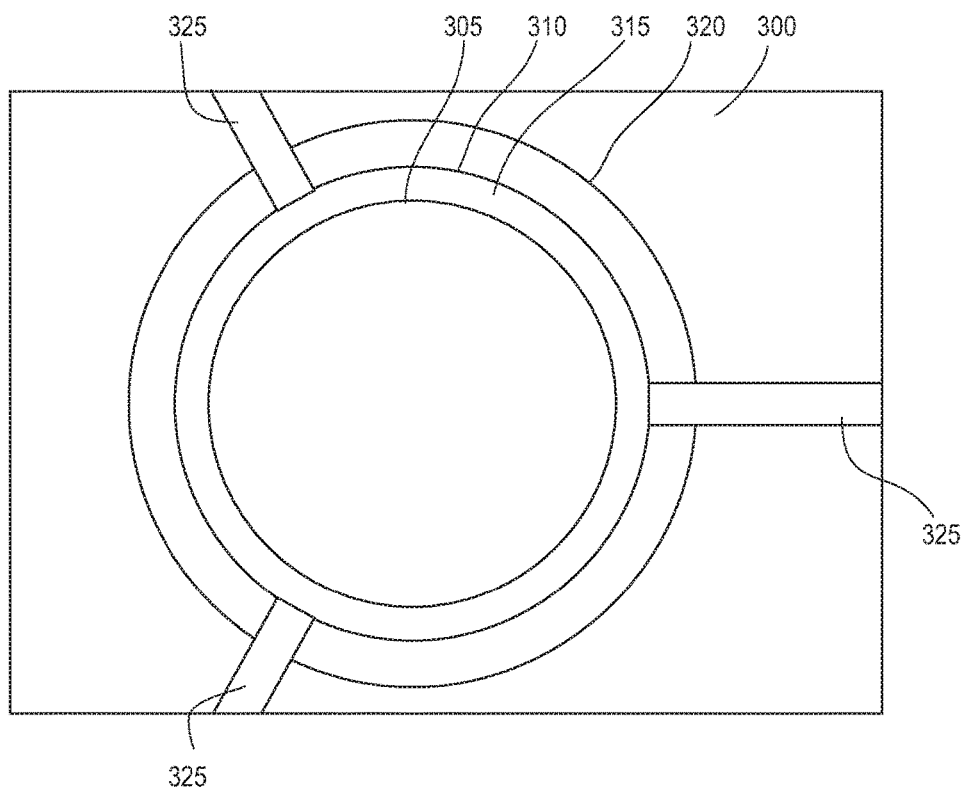
FIG. 3 is a plan view of one of the three ferrite elements of an exemplary circulator of the embodiment of FIG. 1.
Figure 4:
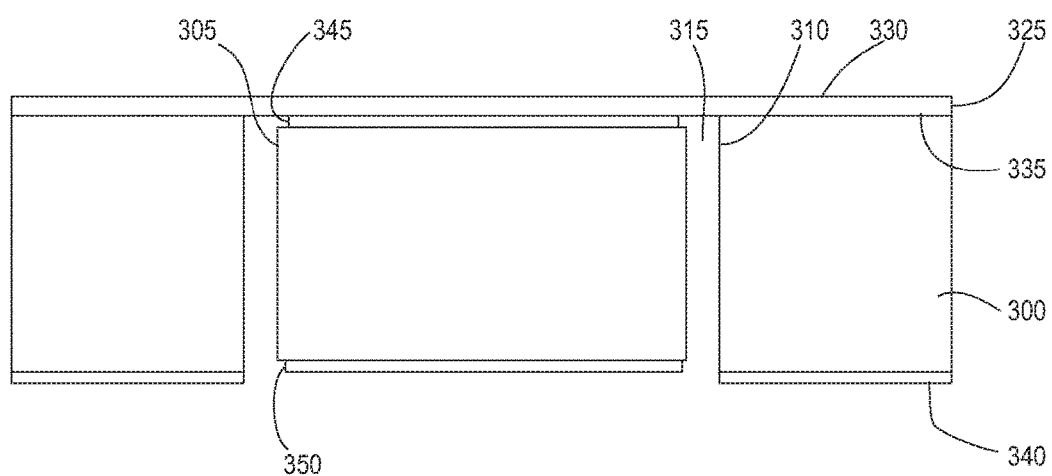
FIG. 4 is a cross sectional view of FIG. 3.

FIGS. 3 and 4 show an enlarged portion of the substrate 100 containing the exemplary ferrite circulator element 165 as a plan view and cross-sectional view, respectively. The semiconductor substrate 100 may use any conventional semiconductor material 300 suited for the frequencies of the RF signals to be carried. For example, indium phosphide as a semiconductor material 300 could be utilized to support W band frequencies. A disk 305 of a self-biased magnetic material, e.g. barium hexaferrite, is embedded into a pocket 315 defined by internal edges 310 in the semiconductor material 300. A Y-junction of metal 320 is oversized relative to the area of the disc 305. Three microstrips 325 are used to couple the three RF signals/ports associated with circulator 165 to and from the circulator. A backside ground 340 covers the bottom of the substrate material 300. Prior to insertion of the ferrite disk, the semiconductor wafer with the substrates will have undergone standard front-side processing. Then, during backside processing, pockets 315 are etched from the rear of the substrate of a size to entirely enclose the respective magnetic disks. Prior to inserting the ferrite disk 305 into the pocket 315 from the backside of the semiconductor material, metallic layers 345 and 350 are adhered to the top and bottom surface of the ferrite disk, respectively. The disks can be mounted by gold-gold thermo-compression or eutectic bonding of metallic layer 345 to the underside junction metallization 325. Following the insertion of the magnetic disks into the substrate, the semiconductor wafers/substrates can then undergo further processing, e.g. additional backside processing or insertion of any needed surface mounted electronic components, if needed.

FIG. 5 shows an exemplary high density utilization 500 of substrates with a phased array antenna system 505. The antenna system 505 includes a plurality of spaced apart, individually driven, antenna elements 510 where the spacing between adjacent elements 510 is D2. As will be appreciated, the antenna system 505 will typically contain a plurality of antenna elements spaced apart in an X-Y grid (only one column of such elements being shown in FIG. 5). In this example, the spacing between adjacent elements D2 is one half wavelength at the highest frequency supported by the antenna system. In this example of a W band antenna system, one wavelength is approximately 3.2 mm so that one half wavelength is approximately 1.6 mm. A plurality of substrates 515, each with an integrated circulator has in accordance with substrate 100, is directly connected to drive a respective antenna element 510. Because the width of the substrates 515 is 1.6 mm, there is physical space to directly connect each substrate to a corresponding one of the respective antenna elements. Although an antenna system has been provided as one example where physical size constraints dictate the need for physically small electronic substrates, there are other applications and requirements in which physically small substrates with integrally incorporated isolator/circulator will provide a substantial advantage, if not necessity.

FIG. 6 shows a top view of an exemplary assembly 600 on an electronic substrate 605 that includes a power amplifier 610 with an input 612. On the remainder of the substrate is an isolator with ferrite disks 615 and 620. An output 622 of the isolator provides a connection point to an antenna. The isolator is similar in construction to the circulator of FIG. 1 with the disks 615 and 620 being contained entirely within corresponding pockets in the substrate. This assembly is also intended for operation in the W band. The substrate has dimensions of width 1.4 mm×length 1.6 mm and a thickness of about 0.1 mm. The isolator provides isolation of about 20 dB across the W band with low insertion loss. Thin film resistors and capacitors in addition to integrated and/or surface mounted semiconductors as well as through-hole interconnections are utilized.

Although exemplary implementations of the invention have been depicted and described in detail herein, it will be apparent to those skilled in the art that various modifications, additions, substitutions, and the like can be made without departing from the spirit of the invention. For example, other semiconductor substrate technologies that could be used include gallium arsenide, silicon carbide, and silicon. A variety of dielectric substrate materials could be utilized as well, e.g. fused quartz, alumina, fused silica. The integration approach explained for the described embodiments would also apply to these semiconductor substrate technologies and dielectric substrate materials, except that a compatible process would be used to etch the pockets. This is mainly related to chemical differences among the substrate materials. A multi-level interconnect layer stack on the front-side of the substrate could be used to provide additional flexibility in the design of the circulator and components used on the substrate. For example, a multi-level interconnect layer stack on the front-side of the substrate would facilitate the use of grounding metallization on the front-side of the substrate which provides the ability to transverse the gap between the semiconductor and ferrite in order to minimize any sensitivity due to dimensional gap variations. In this situation the junction metallization will be of a smaller diameter than the ferrite disks.

The scope of the invention is defined in the following claims:

1. An electronic assembly comprising:
   a planar semiconductor substrate;
   the planar semiconductor substrate having a front side with semiconductor components and a back side that includes at least one recess extending inwardly towards the front side;
   one of an isolator and circulator formed as part of the planar semiconductor substrate;
   the one of an isolator and circulator having at least one magnetic ferrite disk mounted in the at least one recess; and
   the one of an isolator and circulator having at least input and output ports, the input port disposed to receive a radio frequency signal to be coupled with low insertion loss to the output port while providing high insertion loss to other radio frequency radio frequency signals attempting to propagate from the output port to the input port.

2. The electronic assembly of claim 1 further comprising:
   a metal conductor on the front side opposite the at least one recess, the metal conductor defining an end of the at least one recess;
   a layer of metal attached to one surface of the at least one magnetic ferrite disk;
   the at least one magnetic ferrite disk mounted and retained within the at least one recess by attachment of the layer of metal to the metal conductor.

3. The electronic assembly of claim 1 further comprising:
   a power amplifier with components on the front side of the planar semiconductor substrate;
   a PA output of the power amplifier connected to the at least input port.

4. The electronic assembly of claim 1 wherein the at least one magnetic ferrite disk is contained within the thickness of the planar semiconductor substrate.

5. The electronic assembly of claim 4 wherein the thickness of the planar substrate is not more than 0.2 mm.

6. The electronic assembly of claim 1 wherein the one of an isolator and circulator is effective for radio frequency radio frequency signals within the 75-100 GHz range.

7. The electronic assembly of claim 6 wherein the planar semiconductor substrate has a width dimension that is not more than ½ wavelength of the radio frequency radio frequency signal which is substantially 1.6 mm.

8. The electronic assembly of claim 1 wherein the planar semiconductor substrate has a width dimension that is not more than ½ wavelength of the radio frequency radio frequency signal.

9. The electronic assembly of claim 8 further comprising an antenna array having a plurality of driven elements with a spacing among adjacent elements of not more than ½ wavelength of the radio frequency signal, the output port being connectable to a first driven element, the width dimension of the planar semiconductor substrate permitting additional planar semiconductor substrates to be connected directly to respective adjacent antenna elements without physical interference between such adjacent planar semiconductor substrates.

10. An electronic assembly comprising:
    a planar semiconductor substrate;
    the planar semiconductor substrate having a front side with semiconductor components and a back side that includes at least one recess extending inwardly towards the front side;
    a circulator formed as part of the planar semiconductor substrate and having at least one magnetic ferrite disk mounted in the at least one recess, the circulator capable of operating at frequencies between 75-100 GHz;
    the circulator having an transmit port, an output port, and a receive port, the transmit port disposed to receive a radio frequency transmit signal to be coupled with low insertion loss to the output port, the output port disposed to receive a receive radio frequency signal to be coupled with low insertion loss to the receive port, the circulator providing high insertion loss at the receive port to the radio frequency transmit signal; and
    the planar semiconductor substrate having at least one of the width and length dimensions that is not more than ½ wavelength of the radio frequency signal which is substantially 1.6 mm.

11. The electronic assembly of claim 10 further comprising an antenna array having a plurality of driven elements with a spacing among adjacent elements of not more than ½ wavelength of the radio frequency signal, the output port being connectable to a first driven element, the at least one of the width and length dimensions of the planar semiconductor substrate permitting additional planar semiconductor substrates to be connected directly to respective other adjacent antenna elements without physical interference between such adjacent planar semiconductor substrates.

12. The electronic assembly of claim 10 further comprising:
    a metal conductor on the front side opposite the at least one recess, the metal conductor defining an end of the at least one recess;
    a layer of metal attached to one surface of the at least one magnetic ferrite disk;
    the at least one magnetic ferrite disk mounted and retained within the at least one recess by attachment of the layer of metal to the metal conductor.

13. The electronic assembly of claim 10 further comprising:
    a power amplifier with components on the front side of the planar semiconductor substrate;
    a PA output of the power amplifier connected to the transmit port;
    a receive amplifier with components on the front side of the planar semiconductor substrate; and
    an input of the receive amplifier connected to the receive port.

14. The electronic assembly of claim 10 wherein the at least one magnetic ferrite disk is contained entirely within the thickness of the planar semiconductor substrate.

15. The electronic assembly of claim 14 wherein the thickness of the planar substrate is not more than 0.2 mm.

* * * * *